United States Patent [19]

Jhabvala et al.

[11] Patent Number: 4,709,252

[45] Date of Patent: Nov. 24, 1987

[54] INTEGRATED PHOTO-RESPONSIVE METAL OXIDE SEMICONDUCTOR CIRCUIT

[75] Inventors: Murzban D. Jhabvala, Seabrook; David R. Dargo, Arnold; John C. Lyons, Columbia, all of Md.

[73] Assignee: The United States of America as represented by the Administrator, National Aeronautics and Space Administration, Washington, D.C.

[21] Appl. No.: 399,074

[22] Filed: Jul. 16, 1982

[51] Int. Cl.⁴ .................. H01L 27/14; H01L 29/161; H01L 29/78

[52] U.S. Cl. ...................................... 357/30; 357/231; 357/24; 357/30; 357/65; 357/56; 357/61

[58] Field of Search .................. 357/30 B, 30 D, 30 I, 357/23 R, 65, 1, 2, 11, 51, 24 L, 24 R, 56, 61; 250/211 R, 211 J, 338 S, 338 E, 370 X, 370 G

[56] References Cited

U.S. PATENT DOCUMENTS

| | | | |
|---|---|---|---|
| 3,842,274 | 10/1974 | Greene et al. | 357/24 LR |
| 3,873,836 | 3/1975 | Greene | 250/370 G |
| 3,968,360 | 7/1976 | Monnier | 250/211 R |
| 3,988,612 | 10/1976 | Palmer | 250/211 R |
| 4,057,819 | 11/1977 | Owen et al. | 357/30 |
| 4,282,043 | 8/1981 | Chang | 357/65 |
| 4,354,104 | 10/1982 | Chikamunce et al. | 357/30 |

FOREIGN PATENT DOCUMENTS 2027986 2/1980 United Kingdom ............ 357/30 D

OTHER PUBLICATIONS

Andrew J. Steckl et al, "Application of Charge-Coupled Devices to Infrared Detection and Imaging", *Proceedings of the IEEE*, vol. 63 (1975), pp. 67-74.
Henry Levinstein, "Infrared Detectors", *Physics Today*, Nov. 1977, pp. 23-28.
J. M. Engel, "High Thermal Conductance Substrate", *IBM Technical Disclosure Bulletin*, vol. 4 (1962), p. 59.
Application of Charge-Coupled Devices to Infrared Detection and Imaging, A. J. Steckl et al., Proc. IEEE, vol. 63, No. 1, Jan. 1975.

*Primary Examiner*—J. Carroll
*Attorney, Agent, or Firm*—John O. Tresansky; John R. Manning; Robert E. Bushnell

[57] ABSTRACT

An infrared photo-responsive element ($R_D$) is monolithically integrated into a source follower circuit of a metal oxide semiconductor device (10) by depositing a layer of a lead chalcogenide as a photo-resistive element forming an ohmic bridge between two metallization strips (26, 28) serving as electrodes of the circuit. Voltage from the circuit varies in response to illumination of the layer by infrared radiation.

1 Claim, 14 Drawing Figures

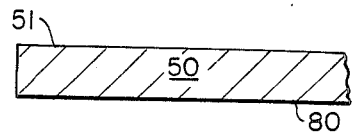
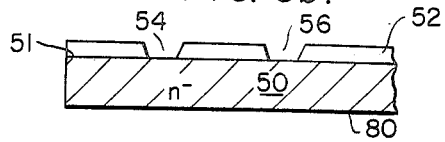
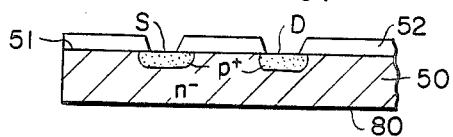
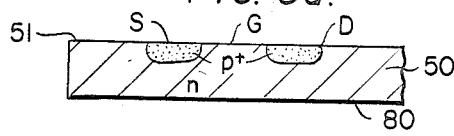
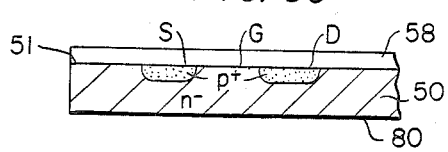
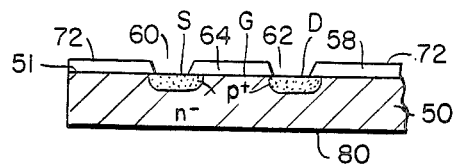
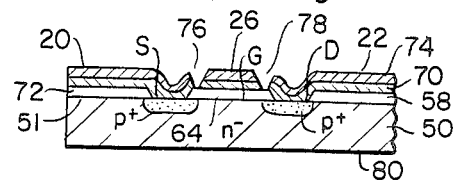
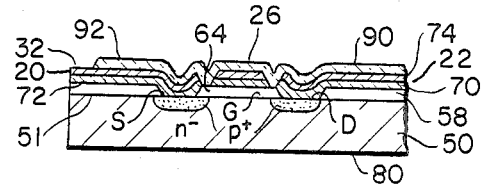
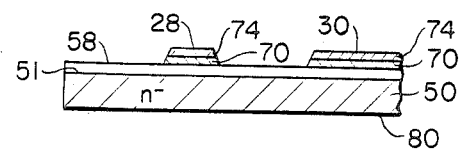
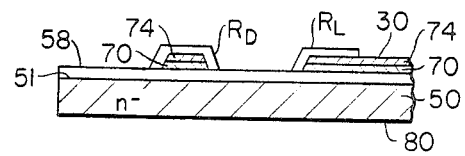
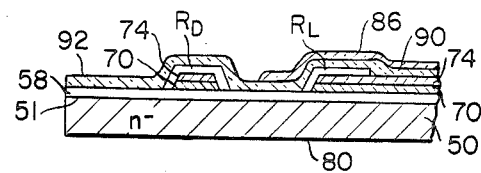

INTEGRATED PHOTO-RESPONSIVE METAL OXIDE SEMICONDUCTOR CIRCUIT

ORIGIN OF THE INVENTION

The invention described herein was made by an employee of the United States government and may be manufactured and used by or for the government for governmental purposes without the payment of any royalties thereon or therefor.

TECHNICAL FIELD

This invention generally relates to integrated semiconductor circuits and, more particular, to metal oxide semiconductor circuits having integrated photo-responsive elements.

BACKGROUND ART

Infrared photo-responsive elements have been found to be particularly useful for sensing the shape and features of remote objects for such purposes as multispectral mapping of the earth's surface. Such applications usually require an array of discrete photo-responsive elements to be positioned at the focal plane of an optical instrument. Current efforts towards producing higher resolution images has created a demand for a focal plane with a greater number of photo-responsive elements because the degree of resolution obtainable is proportional to the number of elements in the array. By way of illustration, one array under consideration has between one and ten thousand elements arranged in a linear array. The demand for higher resolution can be met only by such expedients as reducing the size of the photo-responsive elements because optical considerations tend to limit the area of focal planes.

To derive intelligible image data from the stream of signals generated by focal plane array at least two leads must be used to individually interconnect each photo-responsive element to its own preamplifier or other signal processing step. Typically, the elements in a focal plane array are made with pairs of discrete metal contacts. A pair of fine gold wires serves as interconnecting leads between each pair of contacts and a corresponding signal processing stage. The presence of the contacts and interconnecting leads places an upper limit upon the extent of size reduction achievable with available photo-responsive elements.

The sheer number of interconnecting leads itself presents a serious fabrication and reliability problem which may be exacerbated if the focal plane area must also accommodate cryogenic cooling equipment for the photo-responsive elements. Although available monolithic extrinsic silicon infrared detectors and charge coupled devices eliminate the necessity for interconnecting wires, such devices are not suitable for remote sensing of objects illuminated by reflected sunlight because available extrinsic silicon is not responsive to infrared radiation between 1.65 $\mu$m and 2.3 $\mu$m, and, therefore, is responsive to only part of the spectrum within one of the atmospheric windows.

STATEMENT OF THE INVENTION

Accordingly, it is one object of the present invention to provide an improved photo-responsive element.

It is another object to provide a photo-responsive element monolithically integrated into a metal oxide semiconductor circuit.

It is yet another object to provide an improved interconnection between a photo-responsive element and a metal oxide semiconductor circuit.

It is a further object to provide a compact integrated photo-responsive element and metal oxide semiconductor circuit.

It is also an object to provide a photo-responsive device free of wire lead interconnections between its photodetector element and its preamplifier stage.

These and other objects are achieved by a device having a layer of a lead chalcogenide material forming a photo-responsive element monolithically integrated into a metal oxide semiconductor circuit for processing the signal stream generated by the element. The photo-responsive element is deposited upon an oxide layer of the semiconductor with opposite sides of the layer partially covering and forming ohmic contacts with ends of the two strips of metallization serving as electrodes of the signal processing circuit. Exposure of the element to incident radiation effects a variation in electrical characteristics of the element, thereby causing a responsive change in the signal stream provided to the processing circuit via the metallization electrodes.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like numbers indicate the same or similar components, wherein:

FIGS. 3a through 3h are cross-sectional views taken along line III—III of FIG. 5 showing an active component of the embodiment of FIG. 5 at various steps of fabrication.

FIGS. 4a througuh 4c are cross-sectional views taken along lines IV—IV of FIG. 5 showing a photo-responsive element of the embodiment of FIGS. 1 and 3 at various steps of fabrication.

DETAILED DESCRIPTION OF THE INVENTION

Figure 1:
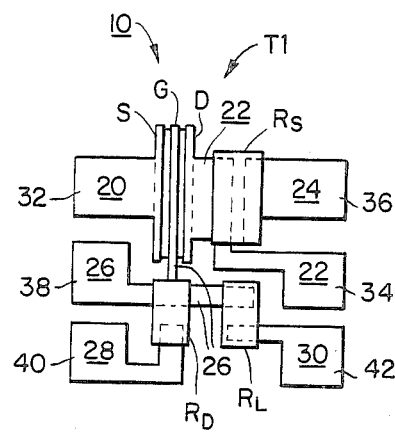
FIG. 1 is a top view showing an embodiment of the present invention.

Refer now to the drawings and, in particular, to FIG. 1 which illustrates a partially completed monolithic device 10 fabricated on a semiconductor substrate to embody the present invention. The device includes an electronic circuit having a metal oxide semiconductor active component integrally interconnected to a photo-responsive element. The active component includes a field effect transistor T1 having three adjoining electrodes with two electrodes, i.e., a source S and drain D, symmetrically arranged on opposite sides of the third, a gate G. Etched strips 20, 22, 24, 26, 28 and 30 formed of a layer of metallization, interconnect the various circuit components with the active component. One exemplary circuit configuration of the device 10 includes a transistor T1 in a source follower configuration 12 schematically represented in FIG. 2. Such a configuration will provide a preamplifier stage for the data stream from the photo-responsive element. The substrate is electrically shorted to the drain region metallization by such techniques as soldering the substrate to an encapsulating case electrically coupled to the drain metallization. Circuit resistances $R_D$, $R_L$ and $R_S$ are formed by discrete islands of lower conducting resistive material bridging various pairs of the metallization strips. This resistive material, a lead chalcogenide, is photo-responsive. One of the islands, $R_D$, is used in the circuit as the photo-responsive element.

Metallization strip 20 has one end making electrical contact with the source region and its other end forming a terminal pad 32 to which external electrical leads may be connected. Metallization strip 22 has one end electrically contacting the drain region and its other end forming a terminal pad 34. An intermediate segment of metallization strip 22 is in ohmic contact with and covered by one side of the layer of material forming resistance $R_S$. One end of metallization strip 24 is in ohmic contact with and partially covered by the other side of resistance $R_S$ while the other end of strip 24 forms a terminal pad 36. Metallization strip 26 has three ends: one end overlying and providing p-channel enhancement of the gate region, another end in ohmic contact with and partially covered by one side of the layer of material forming resistance $R_L$, and its third end forming a terminal pad 38. An intermediate segment of strip 26 is in ohmic contact with and covered by the layer of photo-resistive material forming the photo-responsive element $R_D$. Metallization strip 26 effectively forms a node with resistance $R_L$ and photo-responsive element $R_D$ serving as a voltage divider at the gate electrode. Metallization strip 28 has one end forming a terminal pad 40 and its other end in ohmic contact with and covered by the other side of element $R_D$. Metallization strip 30 has one end in ohmic contact with and covered by the side of resistance $R_L$ opposite strip 26; the other end of strip 30 forms a terminal pad 42.

The structure of device 10 is fabricated on a wafer 50 of an electronic grade semiconducting material such as <111> silicon, shown in FIG. 3a, with three to five ohms per centimeter resistivity. The wafer is lightly doped with phosphorus to exhibit an n-type conductivity. An insulating field layer of silicon dioxide 52, shown in FIG. 3b, is formed on one surface 51 by passing steam and oxygen over the surface while the wafer is maintained at a temperature of approximately 1,000° C. The silicon dioxide layer is coated with negative photoresist and a mask with images defining a pair of spaced windows 54, 56 is exposed against the silicon dioxide layer. The photoresist is developed, exposing the silicon dioxide insulating layer in the areas of windows 54, 56, to a low temperature post-bake to harden the photo-resist. The silicon dioxide within the window areas is removed by immersing the wafer into a buffered hydrofluoric acid etchant solution. The photo-resist is stripped in hot chromic acid and the wafers are rinsed clean. The wafer is then doped by thermal diffusion through windows 54 and 56 to create p-type conductivity source, S, and drain, D, regions extending downward from the surface 51 as shown in FIG. 3c.

The silicon dioxide insulating layer 52 is removed and the surface rinsed clean, as shown in FIG. 3d. Another layer of silicon dioxide 58, shown in FIG. 3e, is then deposited to a controlled thickness by again subjecting the surface to thermal oxidization. Windows 60, 62 are photolithographically etched into the silicon dioxide layer 58 in the same manner as windows 54, 56, as shown in FIG. 3f to partially expose the source and drain regions. The etching process leaves an insulating strip 64 of silicon dioxide completely covering the gate region and parts of the adjoining source and drain regions.

After the wafer shown in FIG. 3f is rinsed and dried, a chromium-gold sandwich of metallization is deposited on the wafer. As shown in FIG. 3g, a thin layer of chromium 70 is initially deposited upon a surface 72 of the silicon oxide layer and the exposed surface areas of the source and drain regions to a depth of about one hundred angstrom units. Then, a layer of gold 74 is deposited over the chromium layer 70 to a depth of about four thousand angstrom units. The metallization is etched in two steps to define the discrete metallizations strips 20, 22, 24, 26, 28 and 30. The gold layer is photolithographically etched with potassium iodide in the first step. In the second step, the chromium layer is photolithographically etched with a mixture of glycerine and hydrochloric acid. Subsequent to completion of both etching steps, metallization strips 20, 22 and 24 are electrically isolated by gaps 76, 78 which are etched through the metallization to the surface of the gate silicon dioxide layer.

Metallization strips 20, 22 extend across the windows 60, 62 in the silicon dioxide layer 58 and form ohmic contacts with the surfaces of the source and drain regions, respectively, exposed by the windows.

The chromium-gold metallization strips provide an electrode structure that is chemically and electrically compatible with both the metal oxide semiconductor active component T1 and with the lead chalcogenide photo-responsive element $R_D$, thereby avoiding the need for wire leads to interconnect the active component and the photo-responsive element. After completion of photolithographic delineation of the metallization of the wafer, shown in FIG. 4a, the photo-responsive element $R_D$ and the circuit resistances $R_L$, $R_S$ are added to the circuit in a chemical deposition process. The base surface 80 of the wafer is mounted on a clean, dry glass slide with an adhesive (e.g., Crystal Bond 509) impervious to attack by highly alkaline solutions. A liquid lead thiourea complex formation is decomposed by a base catalyzed reaction to make a deposition solution. Immediately prior to immersion in the deposition solution, a thickness of thirty to fifty angstrom units of the exposed silicon oxide layer 58 is removed by immersion of the wafer for a few seconds in a solution of three parts water and one part concentrated hydrofluoric acid, thereby cleaning the gold metallization while preparing a fresh silicon dioxide surface for nucleation without damaging the active component structure. The slide mounted wafer is then held immersed in the deposition solution until a first coat of a mirror-like film of lead sulfide is deposited upon all surfaces (the metallization strips and the surfaces 72 of the silicon dioxide insulating layer 52 exposed between the metallization strips) not covered by the adhesive. The wafer is then removed from the solution, rinsed thoroughly with water, and dried. After subsequent coats of lead sulfide are deposited by repeating these immersion, rinsing and drying steps, the wafer is removed from the glass slide and all traces of the adhesive are removed from the wafer. The topography of the metallization strips is clearly apparent through an opaque layer of several lead sulfide coatings, thus facilitating alignment of a lead sulfide delineation mask with the existing circuit pattern on the wafer.

The photo-responsive element $R_D$ and circuit resistances $R_L$, $R_S$ are etched from the multi-coat lead sulfide layer by a photolithographic delineation process. A layer of positive photoresist is spun onto the lead sulfide layer and air dried in a controlled relative humidity environment. A chromium mask defining the pattern of $R_D$, $R_L$ and $R_S$ is aligned with the visible topography of the wafer and the photoresist is exposed through the mask. The pattern is developed and unwanted photoresist removed. Lead sulfide not covered by photo-resist may be removed by several different etching procedures. In one such procedure, the wafer is briefly immersed in fresh, concentrated hydrochloric acid maintained at a temperature between 25° C. and 30° C., gently rinsed in water maintained at the same temperature, blown dry with an inert gas, and examined for undercutting of the lead sulfide pattern of the $R_D$, $R_L$ and $R_S$ islands. If excessive lead sulfide remains outside the pattern, the etching steps are repeated by briefly reimmersing the wafer in hydrochloric acid. When most of the unwanted lead sulfide has been removed, the wafer is immersed in acetone to remove the photoresist covering the $R_D$, $R_L$ and $R_S$ pattern.

The resulting wafer, shown in FIGS. 1 and 4b, has three clearly defined islands of lead sulfide $R_D$, $R_L$ and $R_S$. Opposite under sides of photo-responsive element $R_D$ partially cover and form ohmic contacts with a center section of metallization strip 26 and one end of metallization strip 28. Opposite sides of resistance $R_S$ partially cover and form ohmic contacts with a center section of metallization strip 22 and one end of metallization strip 24. Similarly, opposite sides of resistance $R_L$ partially cover and form ohmic contacts with opposite ends of metallization strips 26 and 30. The photo-responsive element $R_D$ may be sensitized to infrared radiation by briefly heating the element and exposing it to oxygen. Then, the entire surface of the wafer (the lead sulfide elements $R_D$, $R_L$ and $R_S$, the uncovered metallization strips, and the exposed areas of silicon dioxide layer 58) is covered with an electrically insulating passivation layer 90 of silicon dioxide as shown in FIGS. 3h and 4c.

Figure 5:
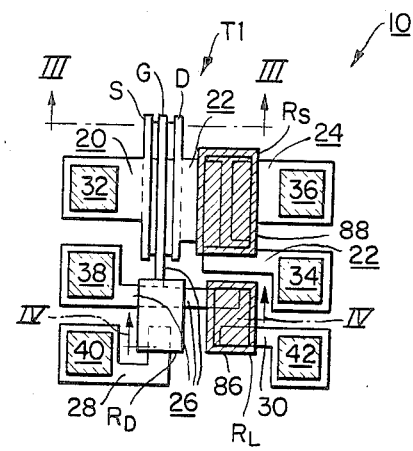
FIG. 5 is a top view showing the embodiment of FIG. 1 in a monolithically integrated circuit.

Lead chalogenides change resistance when illuminated by light, particularly light in the near and intermediate infrared spectrum. To prevent variation of the values of resistances $R_L$ and $R_S$ when the device is exposed to infrared radiation, a layer of an opaque material such as aluminum, is deposited on the surface 92 of the passivation layer 90. The layer is then photolithographically etched to remove all but two areas 86, 88 of the opaque layer which cover resistance $R_L$ (shown in FIG. 4c) and resistance $R_S$, as indicated by the diagonal cross-hatching from upper right to lower left in FIG. 5. Subsequently, windows, shown in FIG. 5 as square areas of diagonal cross-hatching extending from the upper left to the lower right, are etched into the passivation layer 90 to expose the terminal pad areas 32, 34, 36, 38, 40 and 42 for connection to external electrical leads (not shown).

Figure 2:
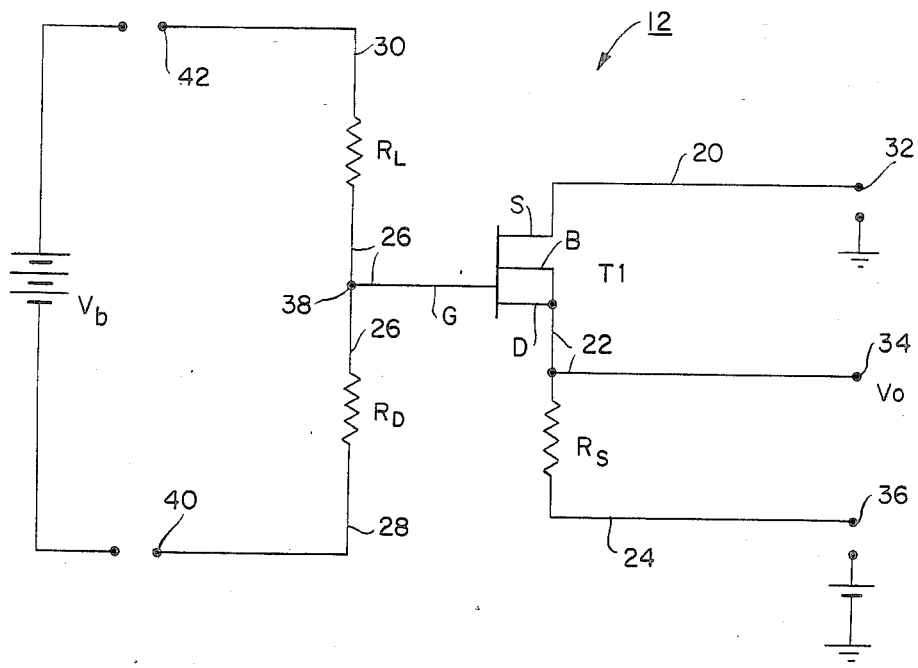
FIG. 2 is a schematic representation of the electrical circuit shown in FIG. 1.

As indicated by FIG. 2, a battery $V_B$ connected to terminal pads 40, 42 provides a voltage across the divider stage formed by resistance $R_L$ and photo-responsive element $R_D$ to bias the gate electrode of transistor T1 to an ON state. Illumination of element $R_D$ with infrared radiation will decrease the resistance value of $R_D$, thereby causing the voltage across the drain and source terminals 34, 32 to decrease in response to the illumination. The voltage, $V_o$, at the drain terminal is related to the resistance provided by element $R_D$ according to the following equation:

$$V_o = V_B \frac{(R_D)}{R_D + R_L} \cdot G_{FET}$$

where, $G_{FET}$, the transistor gain, has a value of about 0.9. It is apparent, therefore, that the value of $V_o$ is an accurate, representation of the illumination to which element $R_D$ is exposed, and is unaffected by spurious impedances which may be introduced by elaborate wire interconnecting leads.

The invention disclosed has an infrared photo-responsive element monolithically integrated into a metal oxide semiconductor circuit to provide a unitary photo-detector and signal processing device. The device may be easily fabricated to provide a circuit such as the source preamplifier for the data stream generated by the detector element. The complete absence of wire interconnecting leads between the photo-responsive element and the active component effectively reduces the space required by each circuit while facilitating fabrication of the device. Consequently, the reduction in size allows a greater density of these devices to be fabricated in a focal plane array, thereby enabling generation of a data stream providing for heightened resolution of focal plane images.

The configuration of the circuit may be modified for particular applications. $R_L$ rather than $R_D$ may b used as a photo-responsive element simply by covering $R_D$ instead of $R_L$ with an opaque layer. Other lead chalcogenide materials such as lead selenide or lead telluride may be used instead of lead sulfide to make the photo-responsive elements and the resistances. The active device may also be made from a substrate having p-type conductivity. The circuit may be made with an active device having either p or n channel depletion or p or n channel enhancement. Additionally, more complex circuits and active lead chalcogenide photo-responsive elements may be monolithically integrated with other active devices in more complex circuits according to the principles disclosed. Also, the devices may be made with a circuit having two or more photo-responsive detector elements made of different binary or ternary lead chalcogenide alloys to provide a spectral response tailored for a particular application.

We claim:

1. A photo-responsive device comprising:
   a substrate (50) of semiconducting silicon containing impurities of a first type conductivity;
   a source (S) region and a drain (D) region containing impurities of a second and opposite type conductivity extending inwardly from a surface (51) of said substrate and separated by a gate (G) region of said first type conductivity;
   a layer (58) of silicon dioxide disposed upon said surface defining discrete openings (60, 62) separated by a strip of said silicon dioxide covering said surface at said gate region;
   a plurality of electrical conductors (20, 22, 24, 26, 28, 30) disposed upon said silicon dioxide layer in a spaced configuration with a first of said electrical conductors making electrical contact with said source region via one of said openings, a second of said electrical conductors making electrical contact with said drain region via another of said openings, and a third of said electrical conductors transversing said strip of silicon dioxide;

a first island ($R_D$) of a lead chalcogenide material exhibiting a photo-responsivity to infrared radiation lying on said silicon dioxide layer in ohmic contact with said third electrical conductor and one of said other of said plurality of conductors;

a second island ($R_L$) of a lead chalcogenide material lying on said silicon dioxide layer in ohmic contact with said third electrical conductor and another of said other of said plurality of conductors; and a layer (86/88) of a material opaque to said infrared radiation completely covering said second island.

* * * * *